(12) United States Patent
Rofe

(10) Patent No.: US 6,654,070 B1
(45) Date of Patent: Nov. 25, 2003

(54) INTERACTIVE HEADS UP DISPLAY (IHUD)

(76) Inventor: Michael Edward Rofe, 2781 Acorn Rd., Bloomfield Hills, MI (US) 48302

( * ) Notice: Subject to any disclaimer, the term of this patent is extended or adjusted under 35 U.S.C. 154(b) by 0 days.

(21) Appl. No.: 09/814,600

(22) Filed: Mar. 23, 2001

(51) Int. Cl.[7] ............................ G02F 1/1333; G09G 5/00
(52) U.S. Cl. ............................ 349/11; 359/630; 345/7
(58) Field of Search .................................. 345/173, 176, 345/7; 349/11; 359/630

(56) References Cited

U.S. PATENT DOCUMENTS 5,920,363 A * 7/1999 Rofe ............................ 349/96
6,091,376 A * 7/2000 Takekawa ..................... 345/7

* cited by examiner

Primary Examiner—Kenneth Parker
(74) Attorney, Agent, or Firm—Bliss McGlynn, P.C.

(57) ABSTRACT

The IHUD is an interactive display system allowing the vehicle driver to select information and view information utilizing LCD and touch screen technology, employing the windshield as the platform. Basically the same LCD technology found on calculators in use and touch screen technology found on interactive video display screens.

13 Claims, 4 Drawing Sheets

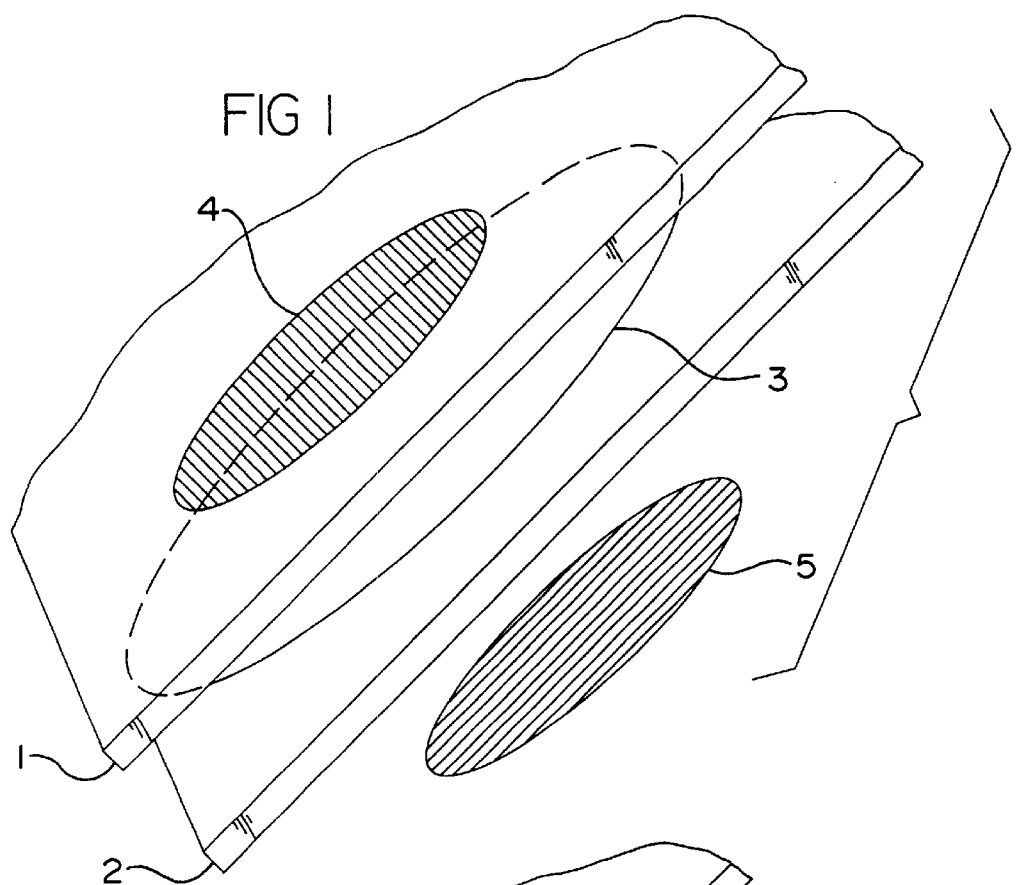
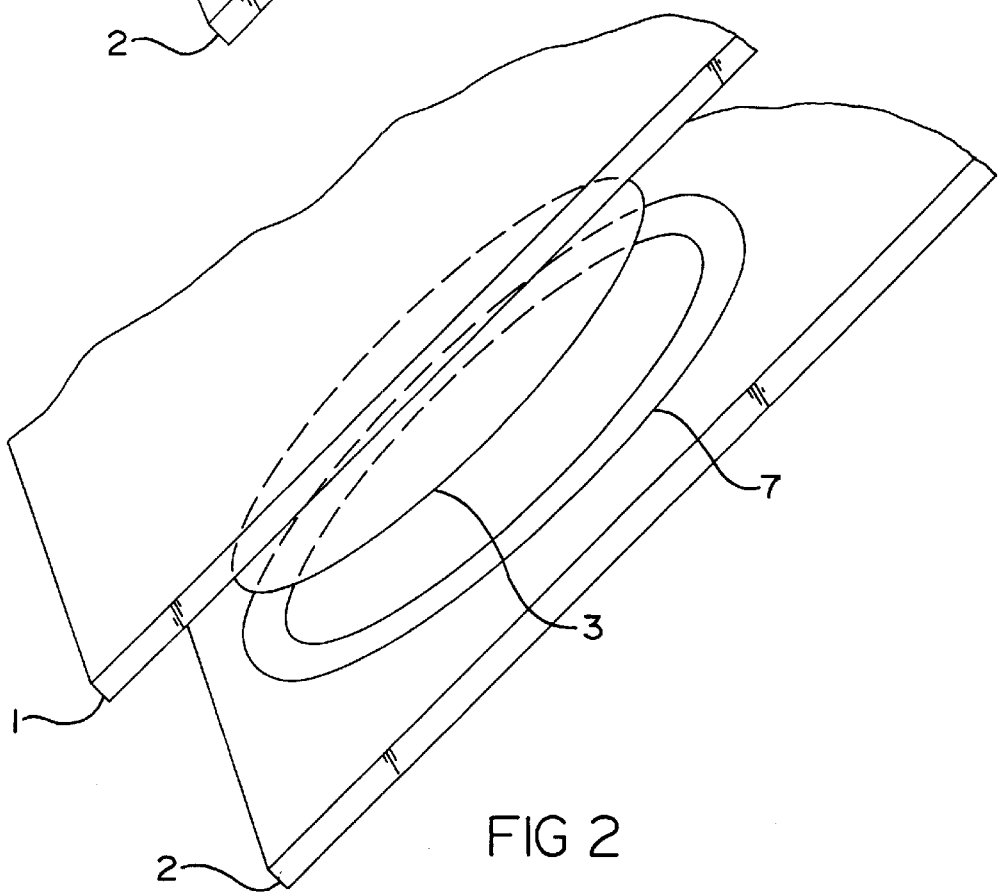

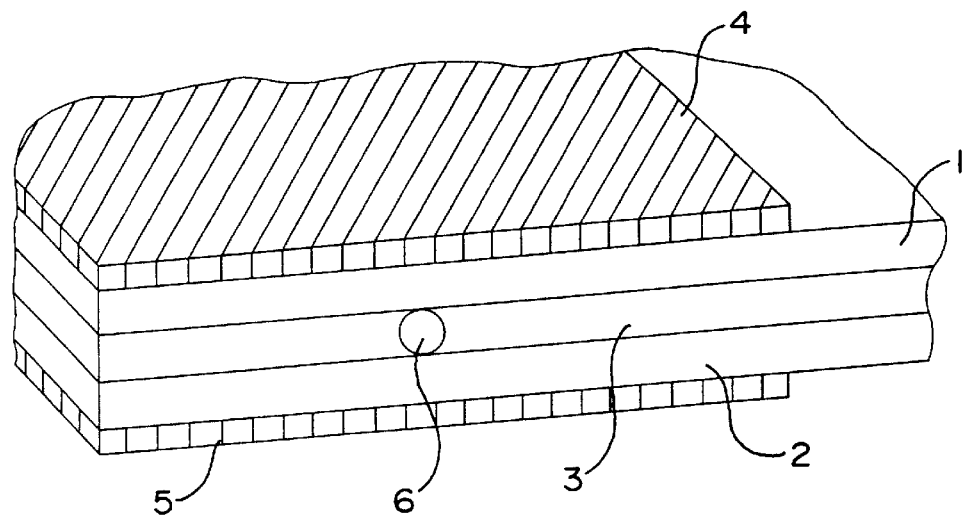
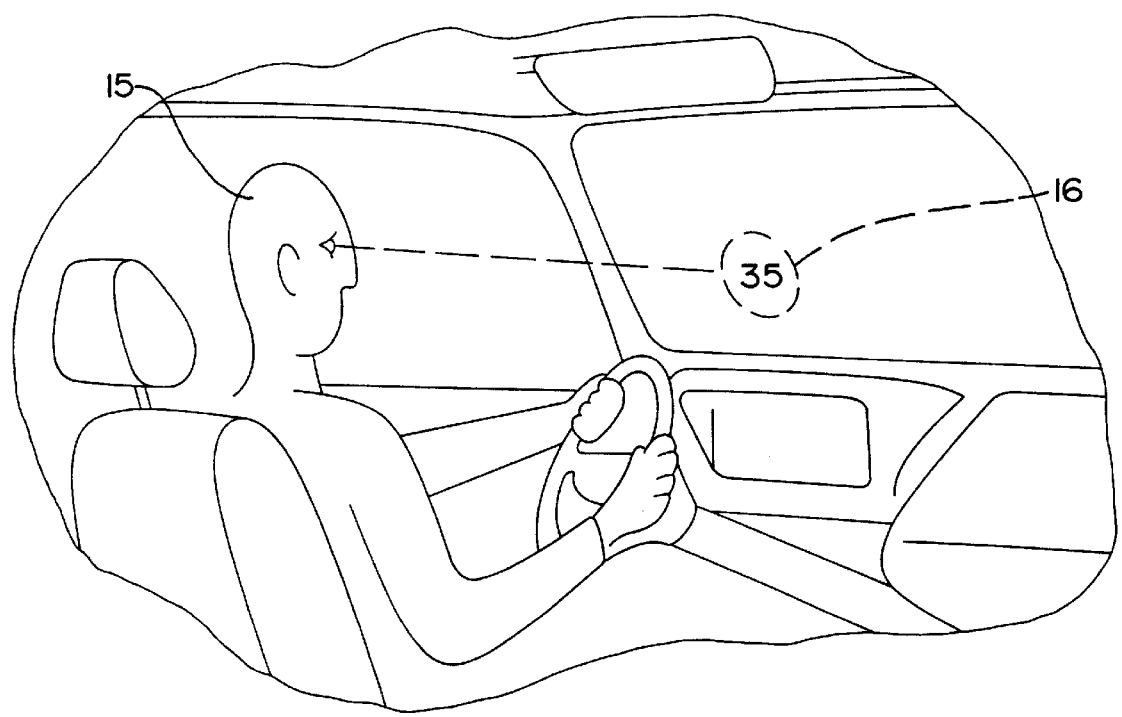

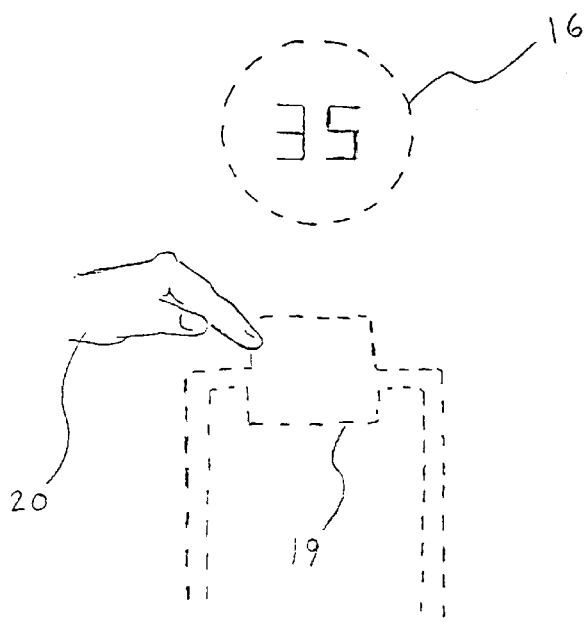
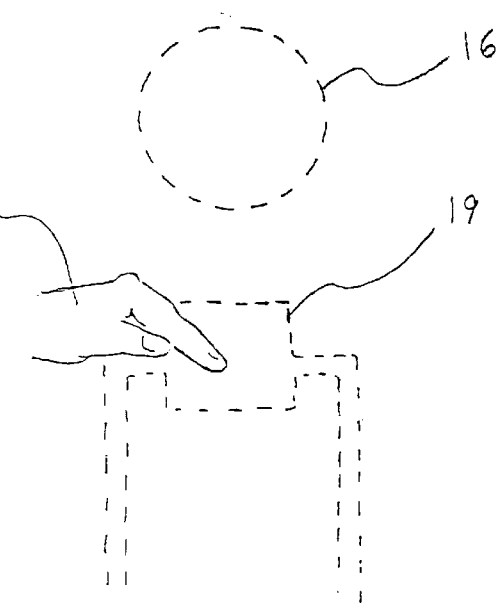
FIG. 7  FIG. 8
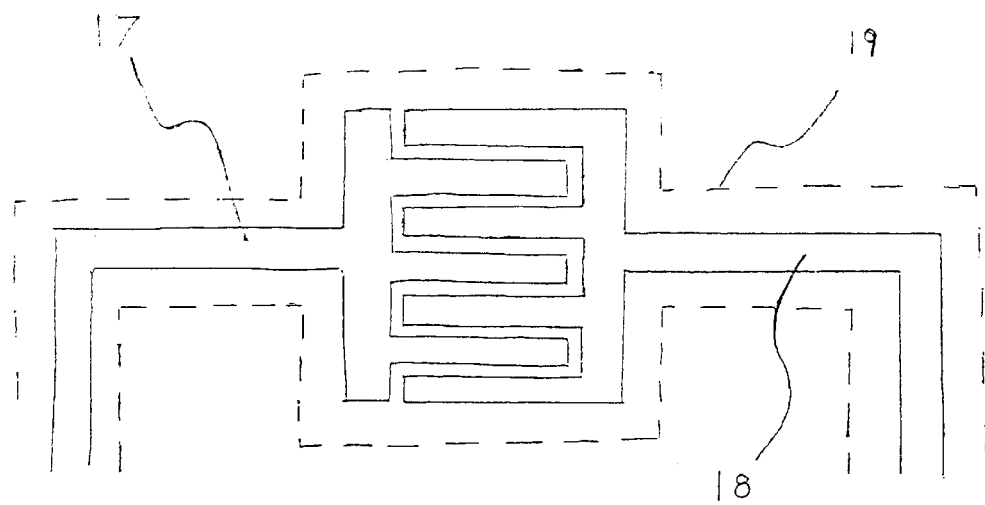
FIG. 6

INTERACTIVE HEADS UP DISPLAY (IHUD)

BACKGROUND OF THE INVENTION

1. Field of the Invention

The present invention relates generally to liquid crystal displays and, more particularly, to a liquid crystal display and touch screen technology for a windshield of an automotive vehicle.

2. Description of the Related Art

1) Liquid-Crystal

The technology of liquid-crystal is well known and extensively utilized. Calculators primarily use liquid-crystal for their numeric displays. These are known as liquid-crystal-displays (LCD). These LCD's are produced in a variety of shapes.

Since liquid crystal molecules respond to an external applied voltage, liquid crystal can be used as an optical switch, or light valve. A common arrangement is two parallel glass plates, each with a polarizing film on its outer side. The space between the plates is filled with the liquid crystal polymer. The technical designation for the most commonly used liquid crystal type is twisted nematic (TN), and the twist refers to the tendency of the polymers to form chains that rotate from one side of the gap between the plates to the other side. This alignment can be changed with an external electric field, allowing the polarization of incoming light to be changed.

Light passing through one of the polarizers, then through the cell (the arrangement of plates, and liquid crystal), has its polarization direction rotated, following the physical rotation of the liquid crystal. When viewed, the cell is clear, or transmitting. A transparent electrical conductor is deposited on the inner surfaces of the glass plates, and patterned into a series of mutually perpendicular lines. If a voltage is placed across the cell gap by addressing the appropriate line on each side of the cell, the liquid crystal reorients to follow the applied electric filed, and the material is "untwisted". As long as the voltage is present, the passage of light will be blocked by the exit polarizer. When the voltage is turned off, the liquid crystal returns to its original state, and the pixel (defined viewing area) becomes clear again. Typical voltages and currents are quite low, which is why liquid crystal displays have been incorporated in battery-operated equipment, and in other applications where power consumption is an issue.

2) Heads-Up-Display (HUD)

Originally developed for the use of the military in fighter aircraft. Now HUD has been translated to broader commercial use in automotive vehicles.

A HUD works by reflecting an image off the windshield into the drivers line of sight. The image presented to the driver is information pertaining to the vehicle's status such as speed. This allows the driver to easily determine the vehicle speed while looking out through the windshield. Thus allowing the driver to maintain their heads up position while driving instead of breaking their view of the road to determine speed. A light intensive image is necessary so that it is able to reflect off the windshield. The equipment necessary to generate the image is set below the windshield and the image generated is projected up into the windshield which in turn is reflected off the windshield and into the drivers line of vision. Sometimes special optics are used to define and focus the image so that after the image is reflected off the windshield the driver is presented with a clear and coherent image.

3) Touch Screen Technology

Touch screen technology is in use on many video screens to enhance user interface. The user can activate software selection simply by touching the display screen. One technical way of detecting if the display screen has been touched has been described in U.S. Pat. No. 3,636,409 by Norman J. Braaten. Transparent electrodes are placed on the surface of the screen. When a person touches one of the transparent electrodes, an increase in capacitance occurs which is sensed by the change in frequency of an oscillator circuit. The oscillations corresponding to the various electrodes are counted and compared to a threshold value to provide an indication of which, if any, of the electrodes has been touched. The software then uses this as input information and resumes with its program.

4) Dashboard Layout and Configuration

Due to the numerous amount of features currently available and with even more desired by designers the available dashboard real-estate is extremely limited. Also the available space is further constrained because some features are essential and required such as airbags. Among the features are things like; engine performance indices (engine temperature, oil pressure, electrical voltages, etc . . . ), air vents, vehicle speed, time, navigation aids, radios, CD players, cassette players, climate controls, cell phones, cup holders, etc . . . . All of these features are competing for very limited dashboard real-estate.

SUMMARY OF INVENTION

According to the present invention, an interactive heads up display (IHUD) is a passive information display and allowing selection that uses the windshield as the actual platform. Passive in the sense that the display isn't generating the light, it simply locks ambient light. Activation of information on the IHUD is accomplished using the windshield as well. The interactive heads up display is the integration of the windshield, an LCD, and a selection device. So that the windshield acts as a multifunction device, as a device to shield the driver from wind, as a display platform and as a device to control the displayed information.

The interactive heads up display includes the following elements, two sheets of glass, a layer of liquid crystal, an annular shaped piece of plastic, three sets of transparent electrodes, two polarizing elements, and equipment to provide a voltage to the interactive heads up display assembly and to measure electrical characteristics.

The two sheets are congruent pieces of glass that when sandwiched together form the windshield. Sandwiched between these two sheets of glass is a very thin layer of liquid crystal. In addition, also sandwiched in between is a clear ring of plastic surrounding the liquid crystal to prevent the liquid crystal from moving so that its position remains static. Two sets of transparent electrodes are positioned at the inner surfaces of both sheets of glass so that electrodes are in direct contact on both sides of the liquid crystal. On the outside sheets of glass two polarizers, crossed with each other, are placed on both sides of the windshield over the region of the liquid crystal, so that any light passing through the liquid crystal will also first pass through one polarizer, the liquid crystal, and then the other polarizer. The windshield can now act as a LCD, except in a see-through mode. Whenever an electric field is applied to the liquid crystal via the transparent electrodes, this causes the region to appear dark. This by the principals of LCD. By arranging the electrodes in an ordered manner, any information can be displayed, such as can be noted by LCD presently found today. The third set of electrodes are attached to the surface of the windshield. This surface being on the interior of the vehicle and accessible to a vehicle driver/occupant. The vehicle driver/occupant can now easily touch these transparent electrodes and change the measured electrical characteristics of these electrodes. This change then be used to switch on or off the displayed information.

The interactive heads up display functions using the similar principals found on touch screen displays and on LCD calculators. Except the glass of the windshield acts as the implementation platform. First the glass acts as selection platform. And also the windshield acts as viewing platform as the case of a calculator. But the glass is not functioning exactly the same because the driver is presented the information by ambient light passing through the windshield.

The purposes of the present invention are as follows:

1. Currently because the space found on dashboards is limited and very valuable in terms of competing interests. The interactive heads up display would provide additional area for information display and selection. Allowing the designers a greater flexibility in designing the vehicle dashboard.

2. Currently the HUDs (heads up displays) used in auto vehicles implement a bulky system of reflectors and a CRT (cathode-ray-tube). The interactive heads up display would constitute a weight saving thus improving the gas mileage of the automotive vehicle. The weight increase would be minimal because the interactive heads up display would be using the windshield as the display platform which is already present on the vehicle. Thus providing an overall net weight savings.

3. The interactive heads up display would also constitute a space savings in place of the old type HUD system. Allowing the designers a greater flexibility in designing the vehicle dashboard by providing room for other instrumentation or increased interior dashboard room.

4. The interactive heads up display (IHUD) would use a minimal amount of current compared with the old type HUD system. Because LCDs (liquid crystal displays) require a minimal amount of current. Thus decreasing the power requirements supplied by the engine which would translate in a savings of fuel which would translate into increased gas milage. Also because of the reduced voltages there would be a corresponding reduction of EMI (Electro-magnetic interference) in the environment. This reduced EMI would improve radio reception due to the reduced noise in the received signal.

5. There is also increased awareness by the driver of the road because in order to make a selection the driver does not have to look away from the road. So fewer breaks of road observation are made.

6. Because the hardware for building an IHUD is less complex and extensive compared to a traditional HUD. Far more vehicles could be equipped with an IHUD, whereas now a HUD would not be considered due to prohibitive cost and weight. Any vehicle that has a windshield could be built with an IHUD as an option with very little redesigning. The electronics responsible for controlling the LCD would be comparable in cost with a hand-held calculator.

7. The cost of manufacture would also be reduced because the cost of attaching electrodes on the windshield would be cheaper than building a separate switch mechanism to control the IHUD.

8. The IHUD allows greater design flexibility than a traditional HUD. The IHUD can place information any-where on the windshield that is desired. A traditional HUD is constrained by the placement of the equipment that reflects the information. No such constraints exist for the IHUD. In addition the IHUD can display information in two separate areas of the windshield at the same time. This is not possible with a traditional HUD. A traditional HUD can only display information in one particular region at one time.

9. The improved visibility in bright daylight. The IHUD would provide a very clear image in bright sunlight. In fact the brighter the day the better the image becomes due to the increased contrast. Unlike the traditional HUD, because the luminous image generated would be more difficult to ascertain against a background of bright or direct sunlight.

BRIEF DESCRIPTION OF THE DRAWINGS

FIG. 1—Is a perspective view showing relationship between polarizers, sheets of glass, and disc-shaped thin film of liquid crystal.

FIG. 2—Is a perspective view showing relationship between sheets of glass, disc-shaped film of liquid crystal, and annular ring of plastic.

FIG. 3—Is a cross-sectional view showing relationship of polarizers, sheets of glass, liquid crystal, and thermoplastic beads.

FIG. 5—Is a perspective view of a interactive heads up display according to the present invention, illustrated in an operational relationship with an automotive vehicle.

FIG. 6—Is a drawing showing an arrangement of two electrodes in an interlocking pattern.

FIGS. 7 and 8—Are two drawings showing a driver/occupant activating the selection interface of the interactive heads up display.

DESCRIPTION OF PREFERRED EMBODIMENT (S)

Figure 4:
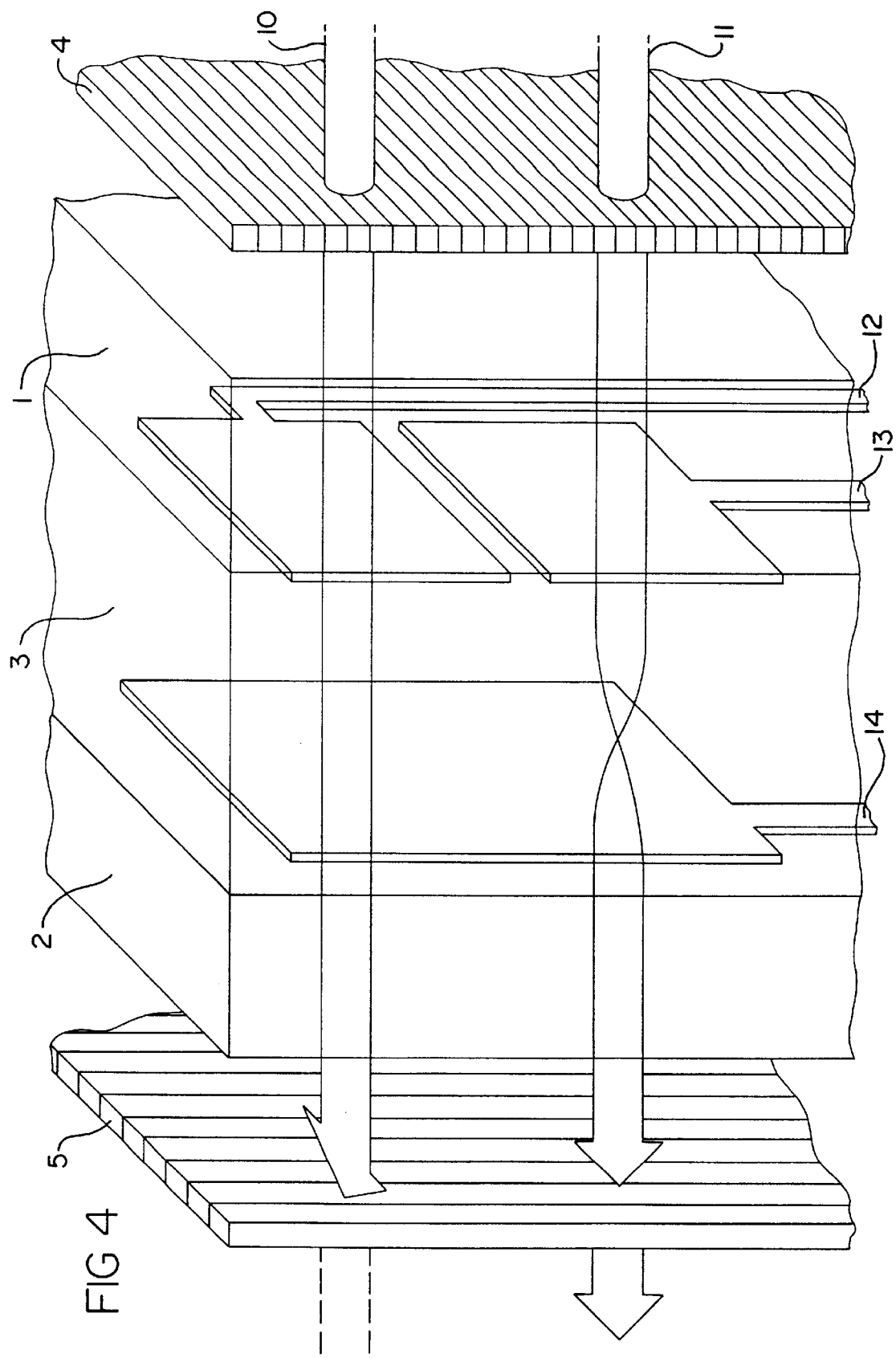
FIG. 4—Is a perspective view showing principals of liquid crystal display.

Referring to the drawings, a interactive heads up display, according to the present invention, includes two pieces of congruent glass 1,2, a thin film of disc-shaped liquid crystal 3, two separate, disc-shaped sheets of polarized thin-film material 4,5, five transparent electrodes 12,13,14,17,18 and a thin film, annular piece of clear plastic 7.

For purposes of clarity the IHUD will be described in two parts. First a method of displaying information will be described. Second a method of information selection using the windshield will be described.

The two pieces of congruent glass 1,2 when placed together form a windshield of a vehicle such as an automotive vehicle. From now on I will refer to the pieces of glass as sheets of glass. I will call one sheet the outside sheet of glass 1 or (outside glass sheet) and the other sheet of glass as the inside sheet of glass 2 or (inside glass sheet). The following paragraph describes why those conventions were chosen.

When this twin-sheeted windshield is on any vehicle and a person was seated inside the vehicle and were to reach forward and touch the windshield, the person would touch the "inside" glass sheet. The other glass sheet, the one exposed to the outside environment, would be called the outside glass sheet.

I will also use the phrase, inner surface. What I am referring to is the surface of a glass sheet that is facing the other glass sheet. When I use the phrase outer surface, I am referring to the surface of a glass sheet that is facing away from the other glass sheet.

There are two sets of electrodes. Whenever I refer to an electrode or electrodes attached to the inner surface of the outside sheet of glass I will say front electrode or front electrodes. Whenever I refer to an electrode or electrodes attached to the inner surface of the inside sheet of glass I will say rear electrode or rear electrodes.

When the two congruent sheets of glass 1,2 are placed together to form the windshield, sandwiched in between the sheets is a thin film of disc-shaped liquid crystal 3 surrounded by a thin-film, annular piece of clear plastic 7 as illustrated in FIG. 2 which shows an exploded view of this relationship. The sole purpose of the piece of clear plastic 7 is to confine the film of liquid crystal so that it remains stationary. The diameter of liquid crystal 3 is approximately two (2) inches. This dimension, for purposes of discussion, is arbitrary, the diameter chosen can be larger or smaller. I have chosen it because I feel it is a reasonable size for the purposes at hand. The thickness of the film of liquid crystal 3 As usually between five (5) and fifty (50) micrometers. The inner radius of clear plastic 7 is approximately two (2) inches which matches the diameter of liquid crystal 3. The outer radius of clear plastic 7 is approximately two and a half (2.5) inches. The general Placement of the liquid crystal within the windshield will be specified later on.

There are two polarizers 4,5. Both polarizers are disc-shaped. Polarizer 4 is attached to the outer surface of the outside glass sheet 1 above the region of the liquid crystal. Polarizer 5 is attached on the opposite side on the outside surface of the inside glass sheet 2 as illustrated in FIG. 1. More specifically; imagine an imaginary point in the center of the disc-shaped liquid crystal 3. Then extend an imaginary perpendicular line from that point in both directions. Now where that imaginary line intersects the outside surfaces of both glass sheets 1,2 another point is formed. Both polarizers 4,5 are centered on these imaginary points on the outside surfaces of both glass sheets 1,2 so that the polarizers 4,5 lie directly above and below the disc-shaped liquid crystal 3. The diameters of both disc-shaped polarizers 4,5 are 1.5 inches. An important point to realize here is that the diameter of the polarizers 4,5 are smaller than the diameter of the disc-shaped liquid crystal 3, which in this case is two (2) inches. The polarizing film would be transparent acrylic and the thickness would be approximately twenty-five (25) micrometers.

Both polarizers 4,5 have lines of polarization. The lines of polarizers 4,5 will be crossed with respect to each other. No matter what the orientation of one polarizer, the lines of polarization of the other must be shifted 90 degrees with respect to the other polarizer. This is done so that the liquid crystal can function as a twisted nematic liquid crystal display.

Another important factor so that the liquid crystal can function as a liquid crystal display is the thickness of the liquid crystal. This is usually between five (5) and fifty (50) micrometers. To help maintain a uniform separation between the glass sheets, thermoplastic beads 6 will be inserted between the sheets of glass 1,2 in the liquid crystal 3 as illustrated in FIG. 3. Once immersed in the liquid crystal 3 the beads 6 become invisible to the eye. Thermoplastic beads are used because their dimensions are relatively invariant when subject to variations of temperature over a large range. In a vehicle this is important as vehicles are typically subject to a wide range of temperatures.

Two sets of transparent electrodes would be attached to the inner surfaces of the windshields. These electrodes are used to subject the liquid crystal to an electric field. The front electrodes are used to apply a positive charge and the rear electrode will act as ground. Although this convention is not necessary, it can be reversed. The transparent electrodes attached to the inner surfaces of the glass sheets 1,2 run from the edge of the glass to an area indicated by the dotted line 16 in FIG. 5. At the edge of the windshield the electrodes are attached to driving electronics (not shown) that control which electrodes have a field applied to them. It should be appreciated that the driving electronics are conventional and known in the art. The transparent electrodes are typically a layer of tin oxide or indium oxide coated on the glass. The purpose of the electrodes are not only to apply an electric field to the liquid crystal but also the manner in which the regions of the electrodes are arranged geometrically fully determines what the LCD looks like. The driving electronics and the arrangement of the electrodes determine what information can be displayed by the LCD. A low voltage is applied to the liquid crystal, for purposes of illustration I will use five (5) volts.

The whole arrangement of liquid crystal and two polarizing films, lie in a region of the windshield (the windshield being constructed by the two sheets of glass 1 2) inside the circular dotted line in FIG. 5. The transparent electrodes terminate within the region of the dotted line and also the terminating regions of the electrodes sandwich the liquid crystal. When the driver 15 looks forward and the driver's gaze meets the windshield this forms an imaginary point. Which I have indicated by drawing a dotted line from point of view of driver to where drivers view would meet the windshield if the driver were looking forward and level. The region I have designated for the display to be, resides within the indicated dotted circular line. This region is somewhat to the right and somewhat lower than the point indicated where the driver's gaze meets the windshield. However this region is not so far to the right that it is in or near the center of the windshield. Again this is only an approximate location that cannot be exactly specified due to the fact that; a viewers height varies from person, heights of seats vary from vehicle to vehicle, vertical and horizontal dimensions of windshields vary, and slopes that windshields are set into vehicles vary.

Referring to FIG. 4, a cross-sectional view of the interactive heads up display with three sample electrodes 12, 13, 14 is illustrated. Electrodes 12 13 are attached to the inner surface of the outside glass sheet. Electrode 14 is attached to the inner surface of the inside glass sheet. Reference numeral 12 will be referred to as the top front electrode, 13 the bottom front electrode and 15 as the rear electrode. Electrodes 12 13 will either have positive voltage applied or no voltage applied from a voltage source. The rear electrode will be attached to the ground or negative of the same voltage source.

I will now choose two light rays entering the interactive heads up display from the outside rays 10 11. To begin with outside or exterior light is unpolarized. In other words the light rays 10 12 are vibrating in random planes. As light rays 10 11 pass through the outside polarizer 4 they both become polarized in the same plane. In this example, for purposes of clarity and illustration, I have chosen the outside polarizer to be horizontally aligned and the inside polarizer to be vertically aligned. However this is not necessary, all that is necessary is that the outside and inside polarizers be rotated ninety (90) degrees out of alignment with respect to each other. So rays 10 11 become polarized in the horizontal plane.

The rays then pass through the outside glass sheet 1. The rays pass through the front electrodes 12 13.

The front top electrode has a voltage applied from the voltage source (not shown). The bottom electrode has no voltage applied to it.

The light rays pass through the liquid crystal.

As ray 11 passes through the liquid crystal 3, the ray 11 twists itself ninety (90) degrees to a horizontal alignment.

As light ray 10 passes through the liquid crystal 3 it remains in its horizontal alignment. The reason for this is because the liquid crystal that ray 10 passes through has an electric field applied to it. This electric field causes the liquid crystal to align itself so that no twisting of light occurs as light passes through. The liquid crystal that ray 11 passes through has no electric field applied to it, because of this, light twists as it passes through the liquid crystal. So when an electric field is applied to the liquid crystal, the liquid crystal aligns itself in such a manner that light aligned in a specific plane does not twist as it passes through. And when no electric field is applied to the liquid crystal, light that is aligned in a specific plane twists as it passes through the liquid crystal.

So now light ray 10 is still aligned in a horizontal plane, and ray 11 is now aligned in a vertical plane, after passing through the liquid crystal 3.

The rays 10 11 pass through the rear electrode and the inside sheet of glass 2.

The rays 10 11 come to the inside polarizer 5. The inside polarizer 5 is vertically aligned. Since ray 11 is now vertically aligned it passes through the inside polarizer 5. However since ray 10 is still horizontally polarized it is blocked by the inside polarizer 5 and does not pass.

To a viewer situated in the path of the oncoming rays, the viewer would only see ray 11 and not ray 10.

So for a viewer observing the region of the two electrodes. The region of the top electrode would be dark, because no light would be passing through, and the region of the bottom electrode would be clear. If both electrodes had a voltage applied, both regions would be dark. If neither had a voltage applied then everything would be clear. If the bottom electrode had a voltage applied, the region of the bottom electrode would be dark and the top would be clear. (An important point to understand is that the liquid crystal that is not between the electrodes will always remain clear due to the fact that there can be no applied electric field.)

So through this method, by strategically placing electrodes and applying voltages to the electrodes, any information can be supplied to the driver/viewer 15. These electrodes would be controlled through the use of electronic circuits. So for example by arranging the electrodes in a seven-segment manner that is found on most calculators one is able display any number from 0 to 9. By arranging two seven-segment sets of electrodes next to each other any number from 0 to 99 can be displayed. So then for example the current speed can be numerically expressed to the driver/viewer 15 any value from 0 to 99. An example is shown in FIG. 5 where the driver/viewer 15 sees the number 35 being displayed. Note the dotted line 16 would not be seen by the driver/viewer 15 only the number 35.

To sum up this is a windshield that is acting as an LCD in a see-through or transmissive mode as opposed to the reflective mode that is currently being utilized in such LCD applications as calculator displays.

An earlier point in the dimension of the polarizers and liquid crystal can now be better explained. I stated that the diameter of the liquid crystal is larger than the diameter of the polarizers. The reason for this is as follows.

If I had specified them both as having the same diameter it is possible that some light could have passed through both polarizers but not the liquid crystal, thus a slight curved line might appear. This is due to the fact that in manufacturing if both are specified as having the same diameter then it is possible that any imprecision in the manufacturing process could cause the diameter of the liquid crystal to be smaller than the polarizers at some point or points. So if the liquid crystal is specified as having a slightly larger diameter any light passing through the polarizers will always pass through the liquid crystal. The important point that I'd like to emphasize is that the diameter should be large enough to prevent light from going through both polarizers without going through the liquid crystal.

Also another important aspect to realize is that anywhere front and back electrodes cross one another and have some liquid crystal between, it should be realized that there lies the potential of changing the alignment of the liquid crystal through an applied electric field. So care should be applied when arranging the electrodes to avoid unwanted changes in the liquid crystal, which would in turn translate to unwanted darkened regions.

An alternate method to the way I've described is a slight variation. Remove the annular piece of plastic, and have the liquid crystal throughout the entire windshield. Basically the thin film of liquid crystal would be the same dimensions as the windshield, the liquid crystal being sandwiched between the two glass sheets. Also the two cross-polarized sheets of film would cover the entire surface of the windshield. This way the transparent electrodes could be placed anywhere on the windshield thus allowing a greater flexibility in the design constraints involving the placement of the electrodes or multiple electrodes.

Next the selection device and method of information selection will be described.

On the surface of the windshield, that is in the vehicle interior, are attached two transparent electrodes 17,18. Attached to the electrodes will be driving/control electronics (not shown). The two electrodes 17,18 will run from the edge of the glass to an area indicated by the dotted line 19. This dotted line cannot be seen by the driver/viewer. The two transparent electrodes will be coupled together in an interlocking pattern such as illustrated in FIG. 6. (Note there are many possible arrangements of this pattern, this is simply one possible pattern). However the electrodes are are not touching at any point and are separated by a small gap for example 1/16 of an inch. The pattern forms something approximating a square. This square is outlined by dotted line 19. And the area of this square will cover an area of approximately 2.5×2.5 inches. The region of the windshield where these electrodes 17,18 are placed will be below the area where information is being displayed by approximately three inches, as shown in FIG. 7. Then as the driver touches the windshield in this defined region the finger of the drivers hand 20 will be contacting both electrodes 17,18 as seen in FIG. 8. The contact will cause an increase of capacitance to occur between electrodes 17,18 which is sensed by control electronics. The change then signals that the electrodes have been touched and will then send a corresponding signal to the display inside dotted line 16. This signal will turn off the display and allow the windshield to go clear as seen in FIG. 8. Or vice-versa. As in, information not displayed can be displayed by receiving a control signal from the control electronics when the screen has been touched in the same area. However because information is not displayed the driver does not know exactly where the region to touch is located. This problem may be overcome by increasing the size of the square defined by the interlocking pattern of electrodes 17,18. In this way the drivers hand 20 must only be sufficiently close to a point in the center of the square region defined by the interlocking pattern of electrodes 17,18 to cause contact in this square region. And so in turn activate and display information. It should be appreciated that another electrical characteristic other than capacitance may be used such as resistive.

The above description shall not be construed as limiting the ways in which this invention may be practiced but shall be inclusive of many other variations that do not depart from the broad interest and intent of the invention.

What is claimed is:

1. A touch screen assembly for an automotive vehicle comprising;
    at least one glass surface wherein said glass is a window of an automobile;
    a layer of liquid crystal defined to be within the physical boundaries of said glass;
    a plurality of electrodes attached to said at least one glass surface, the surface being in vehicle interior; and
    said electrodes closely coupled defining a contact area, said contact area being a region, when touched by an occupant changes electrical characteristics between said electrodes.

2. A touch screen assembly as claimed in claim 1 wherein said electrodes when touched by an occupant cause a change in capacitance to occur between said electrodes.

3. A touch screen assembly as claimed in claim 1 wherein said electrodes when touched by an occupant cause a change in resistance to occur between said electrodes.

4. A touch screen assembly as claimed in claim 1 wherein said electrodes are transparent.

5. A touch screen assembly as claimed in claim 1 wherein said at at least one glass surface is a windshield.

6. A touch screen assembly as claimed in claim 1 wherein said at least one glass surface is a vehicle side viewing pane of glass, whereas viewing is defined by an occupant to see from inside to outside of vehicle.

7. A touch screen assembly as claimed in claim 1 wherein said at least one glass surface is a door vehicle viewing pane of glass, whereas viewing is defined by an occupant to see from inside to outside of vehicle.

8. A touch screen assembly as claimed in claim 1 wherein said at least one glass surface is a rearview mirror.

9. A windshield assembly in an automotive vehicle comprising:
    a windshield;
    a layer of liquid crystal having a first perimeter and defined to be within the physical boundaries of said windshield;
    a plurality of first electrodes attached to a surface of said windshield, the surface being in vehicle interior; and
    said first electrodes closely coupled defining a contact area, said contact area being a region, when touched by an occupant changes electrical characteristics between said first electrodes.

10. A windshield assembly as claimed in claim 9 further including: a first polarizing layer, having a second perimeter, disposed to overlap said layer of liquid crystal so that any polarized light passing through said layer of liquid crystal is due to said first polarizing layer.

11. A windshield assembly as claimed in claim 9 further including a second polarizing layer, having a third perimeter, disposed to overlap said layer of liquid crystal and spaced from said first polarizing layer, said liquid crystal being sandwiched between the first and second polarizing layers.

12. A windshield assembly as claimed in claim 9 further including a transparent second electrode disposed directly adjacent to said layer of liquid crystal.

13. A windshield assembly comprising:
    at least one piece of glass said glass being a window of an automobile;
    a layer of liquid crystal having a first perimeter and associate with said at least one piece of glass to display information from said at least one piece of glass within a field of vision of an operator of a vehicle;
    a transparent first electrode disposed so that it is directly adjacent the layer of said liquid crystal;
    a plurality of second electrodes attached to a surface of said at least one piece of glass, the surface being in vehicle interior; and
    said second electrodes closely coupled defining a contact area, said contact area being a region, when touched by an occupant changes electrical characteristics between said second electrodes.

* * * * *